US007967059B2

(12) United States Patent
Li et al.

(10) Patent No.: US 7,967,059 B2
(45) Date of Patent: Jun. 28, 2011

(54) HEAT DISSIPATION DEVICE

(75) Inventors: Yi-Jiun Li, Taipei Hsien (TW); Shi-Wen Zhou, Shenzhen (CN); Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 305 days.

(21) Appl. No.: 12/241,063

(22) Filed: Sep. 30, 2008

(65) Prior Publication Data
US 2010/0078154 A1    Apr. 1, 2010

(51) Int. Cl.
*H05K 7/20*    (2006.01)
(52) U.S. Cl. .................. 165/80.3; 165/104.33; 361/700
(58) Field of Classification Search .............. 165/80.3, 165/104.33; 361/697, 700
See application file for complete search history.

(56) References Cited

U.S. PATENT DOCUMENTS

| | | | | |
|---|---|---|---|---|
| 6,478,082 B1* | 11/2002 | Li | | 165/185 |
| 6,587,340 B2* | 7/2003 | Grouell et al. | | 361/695 |
| 6,915,844 B2* | 7/2005 | Chou | | 165/104.33 |
| 6,917,522 B1* | 7/2005 | Erturk et al. | | 361/700 |
| 6,938,682 B2* | 9/2005 | Chen et al. | | 165/104.33 |
| 6,964,295 B1* | 11/2005 | Yu et al. | | 165/104.33 |
| 7,000,687 B2* | 2/2006 | Ying et al. | | 165/104.33 |
| 7,018,169 B2* | 3/2006 | Phillip et al. | | 415/60 |
| D614,590 S * | 4/2010 | Lee | | D13/179 |
| 2005/0087329 A1* | 4/2005 | Zhang et al. | | 165/104.33 |
| 2005/0098304 A1* | 5/2005 | Lin et al. | | 165/104.33 |
| 2005/0133199 A1* | 6/2005 | Lo | | 165/80.3 |
| 2006/0032617 A1* | 2/2006 | Chen et al. | | 165/104.33 |
| 2006/0175045 A1* | 8/2006 | Chen | | 165/104.33 |
| 2007/0095508 A1* | 5/2007 | Xia et al. | | 165/104.33 |
| 2007/0133175 A1* | 6/2007 | Wu | | 361/704 |
| 2007/0261822 A1* | 11/2007 | Lin et al. | | 165/104.33 |
| 2009/0168350 A1* | 7/2009 | Xu | | 361/697 |

* cited by examiner

*Primary Examiner* — Allen J Flanigan
(74) *Attorney, Agent, or Firm* — Frank R. Niranjan

(57) ABSTRACT

A heat dissipation device includes a base, a fin group, a plurality of heat pipes connecting the base and the fin group, a fan cover covering the fin group and a fan located at a side of the fan cover. The heat pipes are received in the base and extend through the fin group. The heat pipes are received in two opposite sides of the fin group and sandwiched between the fan cover and the fin group. The fan cover includes a body and a pair of side walls extending from the body. The side walls each include a plurality of heat-dissipating fins formed on an outer surface thereof for increasing heat dissipating surface of the heat dissipating device.

12 Claims, 4 Drawing Sheets

HEAT DISSIPATION DEVICE

BACKGROUND OF THE INVENTION

1. Field of the Invention

The present invention generally relates to a heat dissipation device and particularly to a heat dissipation device having an excellent heat dissipating capability.

2. Description of Related Art

Computer electronic components, such as central processing units (CPUs), generate great amounts of heat during operation thereof. If the heat is not properly dissipated, it can deteriorate an operational stability of the electronic components and damage associated electronic devices. Thus the heat must be removed quickly to ensure normal operation of these electronic components. A heat dissipation device is often attached to a top surface of a CPU to remove heat therefrom.

Conventionally, a heat dissipation device attached to a CPU includes a heat sink having a base and a plurality of fins arranged on the base, and a plurality of heat pipes extending in the base and the fins. In order to promote the heat dissipation effect of the heat sink, fans have been widely used. Consequently, fan covers have been widely used for guiding airflow from the fan to the heat sink and preventing airflow from escaping out of the heat sink without flowing therethrough. However, as CPUs operate faster and faster and produce more and more heat, the effective heat dissipation surface area of the heat sink must be correspondingly increased. Conventional heat sink is difficult to satisfy heat dissipation requirement of modern CPUs.

Therefore, an improved heat dissipating device which has a large heat dissipation surface area is desired.

SUMMARY OF THE INVENTION

According to a preferred embodiment of the present invention, a heat dissipation device includes a base, a fin group, a plurality of heat pipes connecting the base and the fin group, a fan cover covering the fin group and a fan located at a side of the fan cover. The heat pipes have heat-absorbing portions received in the base and heat-dissipating portions extending upwardly through the base into the fin group. The heat heat-dissipating portions of the pipes are received in two opposite sides of the fin group and sandwiched between the fan cover and the fin group. The fan cover includes a body and a pair of side walls extending from the body. The side walls each include a plurality of heat-dissipating fins formed on an outer surface thereof for increasing heat dissipating surface of the heat dissipating device.

Other advantages and novel features will become more apparent from the following detailed description of preferred embodiments when taken in conjunction with the accompanying drawings.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
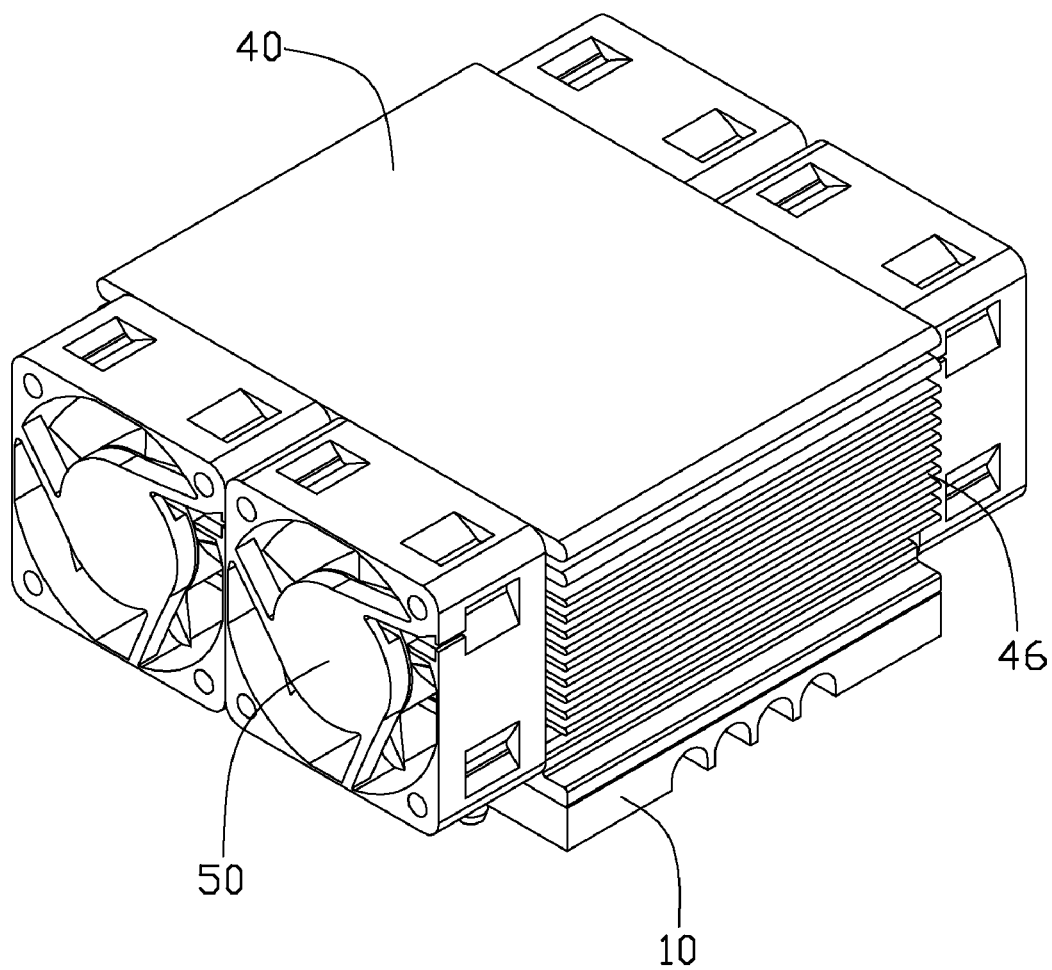
FIG. 1 is an assembled, isometric view of a heat dissipation device in accordance with a preferred embodiment of the present invention.
Figure 2:
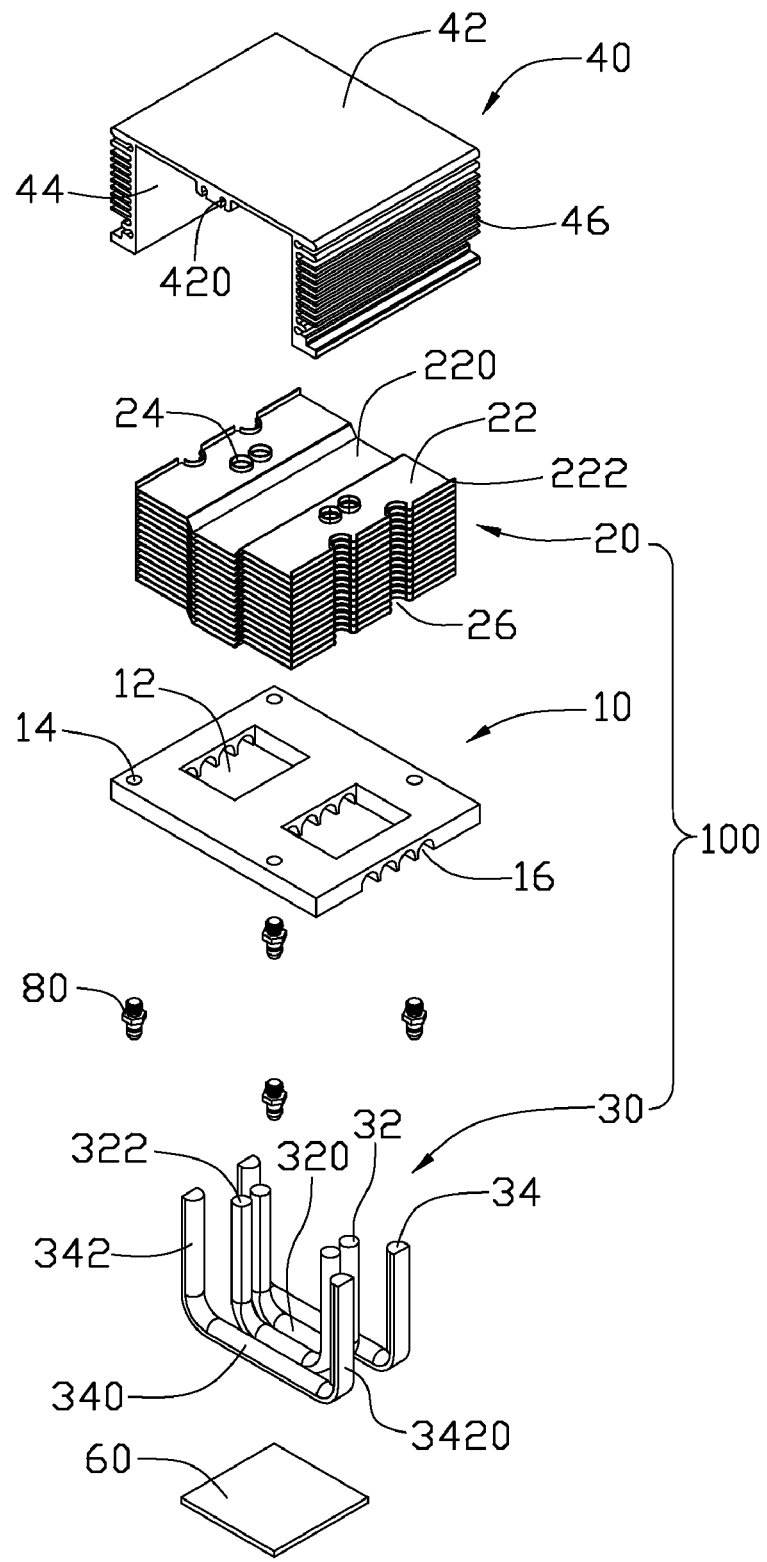
FIG. 2 is an exploded, isometric view of FIG. 1.
Figure 3:
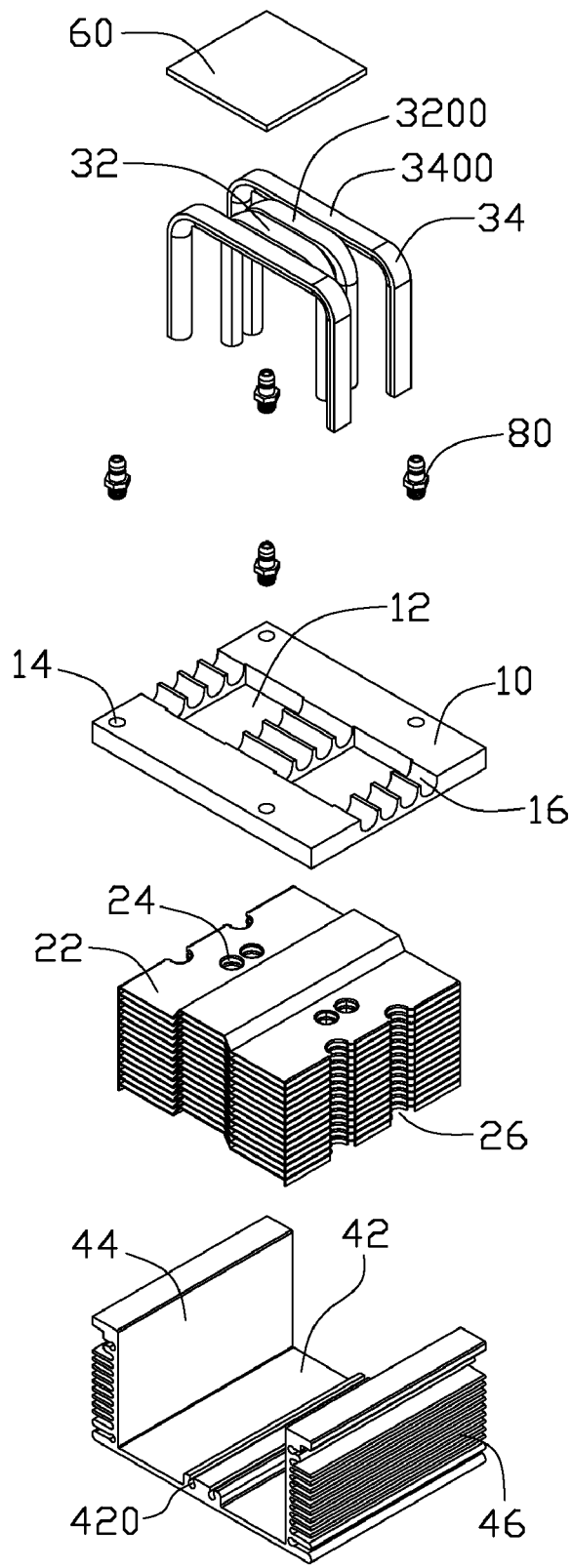
FIG. 3 is an exploded view of FIG. 1, viewed from an opposite aspect.
Figure 4:
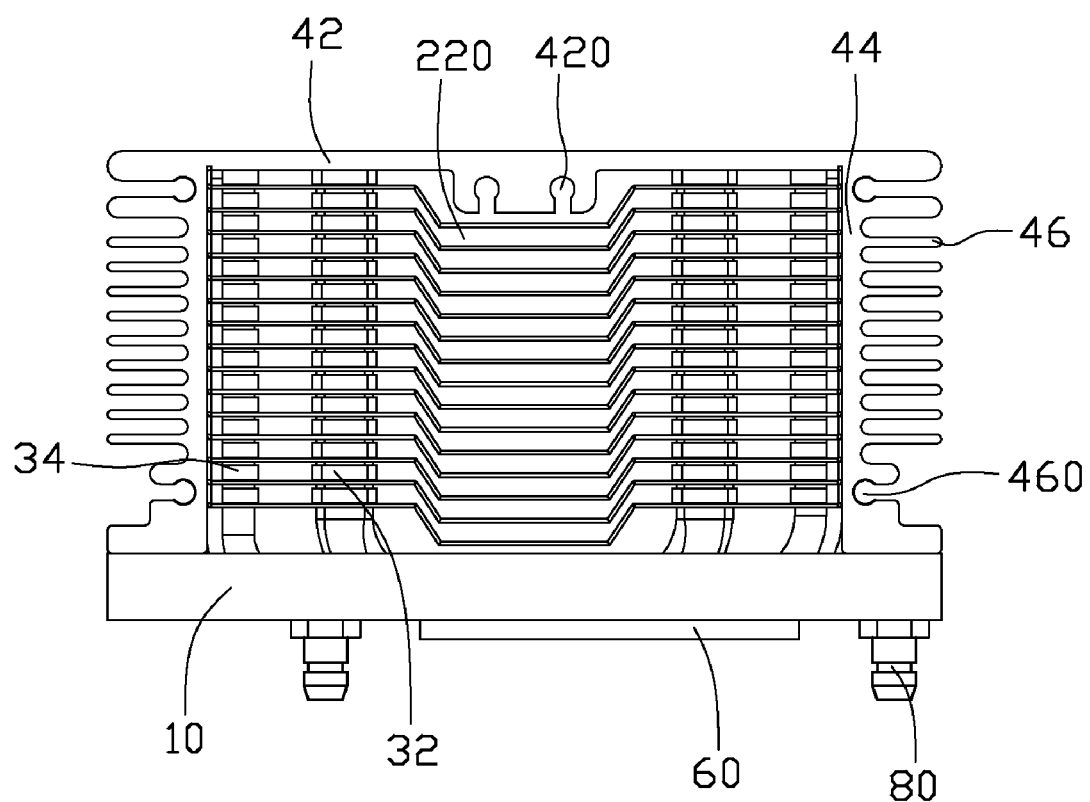
FIG. 4 is a front side view of FIG. 1, with fans of the heat dissipation device being removed for clarity.

Referring to FIGS. 1-4, a heat dissipation device in accordance with a preferred embodiment of the present invention is illustrated. The heat dissipation device comprises a heat sink 100, a fan cover 40 covering the heat sink 100 and four fans 50 located at two opposite front and rear sides of the fan cover 40. The heat sink 100 comprises a base 10, a fin group 20 and a plurality of heat pipes 30 attached to the base 10 and supporting the fin group 20 above the base 10. The fan cover 40 covers the fin group 20 and the fans 50 are arranged in front and in rear of the fin group 20.

The base 10 is made of heat conductive material, such as aluminum or copper. The base 10 is board-shaped and defines a pair of rectangular-shaped openings 12 therethrough, for extension of the heat pipes 30 therethrough to engage with the fin group 30. The base 10 defines four screw holes 14 in four corners thereof, for extension of screws 80 to secure the base 10 to a printed circuit board (not shown) on which a heat-generating component such as a CPU (not shown) is mounted), whereby a heat spreader 60 soldered on a bottom of the heat pipes 30 can have an intimate contact with the CPU. The heat spreader 60 is made of a metal having a high heat conductivity, for example, copper. Four parallel receiving grooves 16 are defined in a bottom surface of the base 10, for receiving the heat pipes 30 therein.

The fin group 20 comprises a plurality of fins 22 which are made of metal sheets. The fins 22 are stacked with each other and parallel to the base 10. Each fin 22 is rectangular and bent to define a recess 220 facing upwardly and located in a middle portion of the fin 22. The recess 220 extends from a front side to a rear side of the fin group 20. By provision of the fins 22 with the recesses 220 therein, heat-dissipating area of the fin group 20 can be increased and strength of the fin group 20 can be improved, whereby noise level can be lowered when airflow produced by the fans 50 passes through channels (not labeled) defined by the fins 22 from the front side to the rear side of the fin group 20. Each fin 22 comprises a pair of flanges 222 respectively formed at left and right side edges thereof to define a plane for attaching to the fan cover 40. Two pairs of receiving holes 24 are defined in the fins 22 and adjacent to the recesses 220. Two pairs of slots 26 are defined in two opposite lateral sides of the fin group 20, for receiving the heat pipes 30. Each pair of the receiving holes 24 is defined in a middle portion of the fins 22 and arranged between a corresponding pair of the slots 26.

The heat pipes 30 comprise a first pair of heat pipes 32 and a second pair of heat pipes 34 located at two opposite sides of the first pair of the heat pipes 32. The first pair of heat pipes 32 each comprises a semicircle-shaped evaporating section 320 and a pair of round condensing sections 34 extending vertically and upwardly from two opposite ends of the evaporating section 320. The evaporating sections 320 of the first pair of heat pipes 32 are received in the receiving grooves 16 of the base 16 and thermally connect therewith. The evaporating section 320 has a flat bottom surface 3200, for facilitating the soldering of the heat spreader 60 to the bottom of the heat pipes 30. The condensing sections 322 are engagingly received in the receiving holes 24 of the fin group 20. The second pair of heat pipes 34 is located to sandwich the first pair of heat pipes 32 therebetween. The second pair of heat pipes 34 each comprises a semicircle-shaped heat-absorbing portion 340 and a pair of semicircle-shaped heat-dissipating portions 342 extending vertically from two opposite ends of the heat-absorbing portion 340. The heat-absorbing portion 340 has a flat bottom surface 3400, for facilitating the soldering of the heat spreader 60 to the bottom of the heat pipes 30. The heat-dissipating portion 342 has a flat outer surface 3420 attached to the fan cover 40. The heat-dissipating portions 342 are engagingly received in the slots 26 of the fin group 20 and the flat outer surface 3420 are coplanar with the planes defined by the flanges 222 of the fins 22 of the fin group 20, whereby the two opposite lateral sides of the fin group 20 and the flat outer surface 3420 can directly contact with the fan cover 40.

The fan cover 40 is U-shaped and made of high heat conductive material, such as aluminum or copper. The fan cover 40 comprises a plate-shaped body 42 and two side walls 44 extending vertically and downwardly from the plate-shaped body 42. The plate-shaped body 42 defines a pair of fixing slots 420 in a middle of an inner wall thereof, extending from a front side to a rear side of the fan cover 40, for extension of fasteners (not shown) therein to secure the fans 50 to the front and rear sides of the fan cover 40. Each side wall 44 integrally forms a plurality of parallel heat-dissipating fins 46 on the outer face thereof by extrusion. The heat-dissipating fins 46 extend in a longitudinal direction of the side walls 44 and a plurality of channels (not labeled) is therefore formed between the heat-dissipating fins 46. Each side wall 44 have a bottom end for attaching on the top surface of the base 10 to mount the fan cover 40 on the top surface of the base 10. A mounting slot 460 is defined in the outer face of the side wall 44, just above the bottom end of the side wall 44, for extension of the a corresponding fastener therein to secure the fans 50 to the front and rear sides of the fan cover 40.

In assembly, the evaporating sections 320 of the first pair of heat pipes 32 and the heat-absorbing portions 340 of the second pair of heat pipes 34 are received in the receiving grooves 16 of the base 10. The condensing sections 322 of the first pair of heat pipes 32 extend through the receiving holes 24 and the heat-dissipating portions 342 of the second pair of heat pipes 34 are received in the slots 26 of the fin group 20, whereby the fin group 20 is supported by the heat pipes 30 and located above the base 10. The bottom ends of the side walls 44 of the fan cover 40 are attached on the top surface of the base 10 by soldering or other means to mount the fan cover 40 on the top surface of the base 10, whereby inner surfaces of the side walls 44 are tightly attached to the planes defined by the flanges 222 of the fins 22 and the flat outer surfaces 3420 of the heat-dissipating portions 342 of the second pair of heat pipes 34 for transferring heat from the CPU via the second pair of heat pipes 34 to the heat-dissipating fins 46. The plate-shaped body 42 of the fan cover 40 contacts with top ends of the condensing sections 322 of the first pair of heat pipes 32 and the heat-dissipating portions 342 of the second pair of heat pipes 34 for transferring the heat from the CPU to the plate-shaped body 42.

In use, the flat bottom surfaces 3200 of the evaporating sections 320 of the first pair of heat pipes 32 and the flat bottom surfaces 3400 of the heat-absorbing portions 340 of the second pair of heat pipes 34 contact with the heat spreader 60 for absorbing heat therefrom. The first pair of heat pipes 32 transfers one portion of the absorbed heat to the fin group 20 where the absorbed heat is dissipated via the fins 22. The second pair of heat pipes 34 transfers other portion of the heat to the fan cover 40 where the heat is dissipated via the heat-dissipating fins 46. The fan cover 40 cooperates with the base 10 to enclose the fin group 20 for preventing forced airflow provided by the fans 50 from escaping from the fin group 20 without flowing through the channels in the fin group 20. The combined fan cover 40 and the base 10 acts as a fan duct. Thus, no additional fan duct is needed. The heat-dissipating fins 46 of the fan cover 40 increase the effective heat dissipation surface of the heat dissipation device. Therefore, the efficiency of the heat dissipation device is improved.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
   a base;
   a fin group defining a plurality of slots in two opposite sides thereof;
   a plurality of heat pipes attached to the base, each of the heat pipes comprising a heat-absorbing portion received in the base and a pair of heat-dissipating portions extending from two opposite ends of the heat-absorbing portion and received in the slots of the fin group;
   a fan cover covering the fin group and attached on the base, the fan cover comprising a body and a pair of side walls extending from the body and attached to the two opposite sides of the fin group, the side walls having a plurality of heat-dissipating fins extending therefrom; and
   a plurality of fans located at a side of the fan cover, the fan cover guiding airflow produced by the fans to pass through the fin group;
   wherein the heat-dissipating portions of the heat pipes received in the slots of the fin group are sandwiched between the side walls of the fan cover and the fin group and thermally connect the side walls of the cover and the fin group, and the heat-dissipating portions each have a flat surface coplanar with the a corresponding side of the fin group and attached to a corresponding side wall of the fan cover.

2. The heat dissipation device as claimed in claim 1, further comprising additional heat pipes each comprising an evaporating section received in the base and a pair of condensing sections extending from two opposite ends of the evaporating section and extending through the fin group, the condensing sections being in contact with the body of the fan cover.

3. The heat dissipation device as claimed in claim 2, wherein the fin group comprises a plurality of fins each defining a recess therein, the recess extending from one end to an opposite end of the fin group.

4. The heat dissipation device as claimed in claim 3, wherein the base defines a plurality of receiving grooves in a bottom thereof, the heat-absorbing portions being received in the receiving grooves and the heat-dissipating portions being extended through the base to be received in the slots of the fin group.

5. The heat dissipation device as claimed in claim 4, wherein each of the fins has a pair of flanges extending from two opposite side edges thereof, planes defined by the flanges being attached to the side walls of the fan cover, respectively.

6. The heat dissipation device as claimed in claim 5, wherein the heat-dissipating portions of the heat pipes each have a flat surface coplanar with a corresponding plane defined by the flanges of the fins of the fin group.

7. The heat dissipation device as claimed in claim 1, wherein each side wall integrally forms the heat-dissipating fins on the outer face thereof by extrusion.

8. A heat dissipation device comprising:
a heat spreader adapted for contacting a heat-generating electronic component;
a plurality of first heat pipes having bottoms attached to the heat spreader, each of the first heat pipes comprising a heat-absorbing portion and a pair of heat dissipation portions;
a plurality of second heat pipes having bottoms attached to the heat spreader, each of the second heat pipes comprising an evaporating section and a pair of condensing sections;
a base covering the heat-absorbing portion and the evaporating section of each of the first and second heat pipes;
a fin group located over the base, wherein the heat-dissipating portions and the condensing sections of the first and second heat pipes extend upwardly through the fin group; and
a fan cover mounted on the base and receiving the fin group therein, wherein the fan cover has fins formed thereon for increasing heat dissipation area; and
a fan mounted to the fan cover, wherein an airflow generated by the fan is confined by the fan cover to flow through the fin group before leaving the fin group;
wherein the heat-dissipating portions of the first heat pipes thermally connect with the fin group and the fan cover, the fin group has two lateral sides engaging with side walls of the fan cover, and the heat-dissipating portions each have a flat surface coplanar with a corresponding lateral side of the fin group and attached to a corresponding side wall of the fan cover.

9. A heat dissipation device comprising:
a base;
a fin group defining a plurality of slots in two opposite sides thereof, the fin group comprising a plurality of fins each having a pair of flanges extending from two opposite side edges thereof;
a plurality of heat pipes each comprising a heat-absorbing portion received in the base and a pair of heat-dissipating portions extending from two opposite ends of the heat-absorbing portion and received in the slots of the fin group;
a fan cover covering the fin group and attached on the base, the fan cover comprising a body and a pair of side walls extending from the body and attached to the two opposite sides of the fin group; and
a plurality of fans located at a side of the fan cover, the fan cover guiding airflow produced by the fans to pass through the fin group;
wherein the heat-dissipating portions of the heat pipes are sandwiched between the side walls of the fan cover and the fin group to thermally connect the side walls of the fan cover and the fin group, two planes defined by the flanges of the fins at two opposite sides of the fin group are attached to the side walls of the fan cover, respectively, and the heat-dissipating portions of the heat pipes each have a flat surface coplanar with a corresponding one of the planes defined by the flanges of the fins.

10. The heat dissipation device as claimed in claim 9, wherein the base defines a plurality of receiving grooves in a bottom thereof, the heat-absorbing portions being received in the receiving grooves and the heat-dissipating portions being extended through the base to be received in the slots of the fin group.

11. The heat dissipation device as claimed in claim 9, further comprising additional heat pipes each comprising an evaporating section received in the base and a pair of condensing sections extending from two opposite ends of the evaporating section and extending through the fin group, the condensing sections being in contact with the body of the fan cover.

12. The heat dissipation device as claimed in claim 9, wherein each of the side walls integrally forms a plurality of heat-dissipating fins on the outer face thereof by extrusion.

\* \* \* \* \*